(12) United States Patent
Sechi et al.

(10) Patent No.: US 6,424,927 B1
(45) Date of Patent: Jul. 23, 2002

(54) COMPUTER-BASED REAL-TIME TRANSIENT PULSE MONITORING SYSTEM AND METHOD

(75) Inventors: Paolo Giovanni Sechi, Redwood City; Richard Cosmo Adamo, Palo Alto, both of CA (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 09/335,655

(22) Filed: Jun. 18, 1999

(51) Int. Cl.[7] ............................................... G06F 15/54
(52) U.S. Cl. ........................ 702/126; 702/4; 702/57; 702/60; 702/122; 702/189; 340/539
(58) Field of Search .................... 702/4, 57–59, 702/66, 69, 70, 73, 74, 60–62, 78, 79, 110, 111, 122, 124, 126, 117, 189–191, 197, 198, FOR 103, FOR 104, FOR 106, FOR 109, FOR 110, FOR 134, FOR 135, FOR 164, FOR 166, FOR 170, FOR 171; 700/292, 293, 294, 286, 73, 74; 340/539, 531, 511; 341/122, 132; 361/111, 93.2, 91.1, 93.1; 324/72

(56) References Cited

U.S. PATENT DOCUMENTS

| 3,578,957 A | * | 5/1971 | Gatlin ..................... 235/150.1 |
| 3,629,852 A | | 12/1971 | Thexton et al. .......... 340/172.5 |
| 3,711,771 A | * | 1/1973 | Hume et al. .............. 324/57 R |

(List continued on next page.)

FOREIGN PATENT DOCUMENTS

| DE | 41 33 209 A1 | 4/1993 |
| EP | 0 058 502 A2 | 8/1982 |
| WO | WO 99/48270 | 9/1999 |

OTHER PUBLICATIONS

Catalogue:*Electronic Welt 1997*, Conrad Electronic, Hirschau XP002148002 pc Messkarte mc–pc 20, p. 1033.

Diendorfer et al. "*Aldis—Das Oesterrichische Blitzortungssystem Elektrotechnik und Informationstechnik,* " At, Springer Verlag Wein__, vol. 109, No. 5, 1992, pp. 261–266 XP000304331 ISSN: 0932–383X pp. 265–266.

*Primary Examiner*—Marc S. Hoff
*Assistant Examiner*—Carol S W Tsai
(74) *Attorney, Agent, or Firm*—Testa, Hurwitz & Thibeault LLP (57) ABSTRACT

A computer-based transient pulse monitoring system and method are described. A general-purpose computer system having a processor, memory, and a digital signal bus for conveying digital signals, also includes a circuit board for measuring certain parameters associated with transient phenomena. The circuit board includes analog circuitry for receiving an analog input signal representing transient phenomena. The analog circuitry continuously measures a characteristic of the transient phenomena and produces an analog output signal representing the measured characteristic. The circuit board also includes a digital interface in communication with the analog circuitry and the digital signal bus. The digital interface converts the analog output signal into a digital signal representing the measured characteristic and transmits the digital signal onto the digital signal bus. The computer system can be connected to a network, such as the Internet. Other systems connected to this network can access the measurements obtained by the computer system of the invention using standard browser technology or file transfer protocols.

18 Claims, 9 Drawing Sheets

U.S. PATENT DOCUMENTS

| | | | | |
|---|---|---|---|---|
| 4,023,071 A | * | 5/1977 | Fussell | 361/56 |
| 4,301,508 A | * | 11/1981 | Anderson et al. | 364/483 |
| 4,368,519 A | * | 1/1983 | Kennedy | 364/483 |
| 4,442,496 A | * | 4/1984 | Simon et al. | 364/524 |
| 4,870,534 A | * | 9/1989 | Harford | 361/58 |
| 5,170,359 A | * | 12/1992 | Sax et al. | 364/481 |
| 5,440,566 A | * | 8/1995 | Spence et al. | 374/41 |
| 5,666,255 A | * | 9/1997 | Muelleman | 361/111 |
| 5,724,219 A | * | 3/1998 | Narita | 361/111 |
| 5,740,080 A | * | 4/1998 | Shook et al. | 364/557 |
| 5,914,662 A | * | 6/1999 | Burleigh | 340/635 |
| 5,959,815 A | * | 9/1999 | Gilbert | 361/1 |
| 6,018,300 A | * | 1/2000 | Dowden et al. | 340/635 |
| 6,026,355 A | * | 2/2000 | Rahman et al. | 702/189 |
| 6,064,172 A | * | 5/2000 | Kuznetsov | 318/716 |
| 6,097,582 A | * | 8/2000 | John et al. | 361/79 |
| 6,104,582 A | * | 8/2000 | Cannon et al. | 361/1 |
| 6,118,639 A | * | 9/2000 | Goldstein | 361/55 |
| 6,175,808 B1 | * | 1/2001 | Chai | 702/4 |

* cited by examiner

COMPUTER-BASED REAL-TIME TRANSIENT PULSE MONITORING SYSTEM AND METHOD

FIELD OF THE INVENTION

The invention relates generally to monitoring systems. More specifically, the invention relates to a system and method for computer-based, real-time monitoring and measuring of transient phenomena.

BACKGROUND OF THE INVENTION

Transient phenomena pose a serious threat to systems that are exposed to such phenomena. Transients can occur at any time with varying amplitude, frequency, and duration. The energy of transient phenomena can couple into the electronic or mechanical components of these systems to cause temporary or permanent malfunction. Because of the potentially destructive nature of transients, therefore, industry has developed various transient-monitoring systems for detecting and measuring transients that occur near mission-critical systems.

A common source of one type of transient phenomena is lightning, which can threaten the successful operation of various mission-critical systems. For example, current procedures typically suspend launch operations of spacecraft in the event of nearby or direct lightning strikes until system level tests can be performed to ensure that the electromagnetic transients produced by the lightning have not damaged or disturbed the payload or launch vehicle systems. These retest operations are costly and often unnecessary. By placing electromagnetic sensors strategically near the payload and launch vehicles, an assessment of the potential damage caused by lightning-induced transients can be made from the transient information captured by these sensors. Other useful applications for transient monitoring include, for example, characterizing charging of spacecraft and monitoring transients on powerlines.

A purpose of a transient-monitoring system is to measure certain key parameters that are indicative of the potentially destructive nature of detected transients. These key parameters can include positive and negative peak amplitudes, duration of positive and negative transients, and the rate of rise of the positive and negative transients. Such parameters of transients have been empirically determined to correlate to problems experienced by electronic systems due to transients.

To characterize key parameters of transient phenomena, present transient monitoring systems often directly digitize the analog input obtained from the sensors. A microprocessor then quantifies the desired parameters from the digitized information. Such digitizers encounter problems, however, at high frequencies. To accurately capture transients at high frequencies, these digitizers need to sample the analog input at high sample rates, which require large amounts of computer memory to acquire the data samples. Consequently, memory capacity limits the duration for which the digitizer can collect data samples. Moreover, data sampling must be suspended to allow the processor to transfer the collected data representing the analog input out of the acquisition memory.

During this downtime, any analog input signals arriving at the digitizer are not sampled. In addition, this downtime can occur at inopportune moments. Any transient phenomena occurring during the downtime can go undetected and be lost. The high frequency transients associated with lightning, for example, can exacerbate the possibility of such an occurrence. The loss of such information may lead to an erroneous and potentially disastrous conclusion that the monitored system has not been exposed to harmful transients.

SUMMARY OF THE INVENTION

The invention features a computer-based transient pulse monitoring apparatus and method that are substantially free of the limitations of known digitizing systems. In one aspect, the invention includes a circuit board for use in a general-purpose computer system, including a processor, memory, and a digital signal bus for conveying digital signals. The circuit board is used for characterizing transient phenomena that occur at a monitored location. The circuit board comprises analog circuitry for receiving an analog input signal representing transient phenomena detected at the monitored location. The analog circuitry continuously measures a characteristic of the detected transient phenomena and produces an analog output signal representing the measured characteristic. The circuit board also includes a digital interface in communication with the analog circuitry and the digital signal bus. The digital interface converts the analog output signal into a digital signal representing the measured characteristic and transmits the digital signal onto the digital signal bus.

In one embodiment, the analog circuitry includes a peak detector for measuring a peak value of the characteristic attained by the analog input signal during a sampling interval. The peak detector comprises: (a) hold circuitry for holding the peak value; (b) input circuitry for providing a current value of the characteristic from the analog input signal; and (c) reset circuitry coupled to the hold circuitry and the input circuitry. The reset circuitry resets the peak value held by the hold circuitry to the current value at the start of a subsequent sampling interval. Consequently, resetting the sample-and-hold circuitry does not interfere with the continuous measurement of the transient characteristic.

In another aspect, the invention features a general-purpose computer system comprising memory, a motherboard having a digital signal bus, and a processor in communication with the memory and the digital signal bus. The computer system also includes a circuit board comprising analog circuitry for receiving an analog input signal representing transient phenomena detected at the monitored location. The analog circuitry continuously measures a characteristic of the detected transient phenomena and produces an analog output signal representing the measured characteristic. The circuit board also includes a digital interface in communication with the analog circuitry and the digital signal bus. The digital interface converts the analog output signal into a digital signal representing the measured characteristic and transmits the digital signal onto the digital signal bus.

In one embodiment, the computer system is connected to a network (e.g., the Internet). Other systems connected to this network can access information corresponding to the measured characteristic as the computer system produces and records the information.

In yet another aspect, the invention features a transient monitoring system that includes a transducer installed at a location exposed to transient phenomena. The transducer produces an analog input signal representing detected transient phenomena. The monitoring system also includes a sensor system coupled to the transducer. A general-purpose computer system of the sensor system includes a circuit board having analog circuitry for receiving the analog input signal representing transient phenomena detected by the transducer. The analog circuitry continuously measures a characteristic of the detected transient phenomena and produces an analog output signal representing the measured characteristic. The circuit board also includes a digital interface in communication with the analog circuitry and a digital signal bus of the computer system. The digital interface converts the analog output signal into a digital signal representing the measured characteristic and transmits the digital signal onto the digital signal bus.

In one embodiment, the computer system of the transient monitoring system is connected to a network over which other systems connected to the network can access information corresponding to the measured characteristic as the computer system produces and records the information.

In still yet another aspect, the invention features computer system connected to a client-server network. The computer system includes a transient monitor that produces data representing a characteristic of transient phenomena detected at a monitored location. A processor stores the produced data in a format that permits access to the data by other computer systems on the network.

In still another aspect, the invention features a method for monitoring transient phenomena. At a circuit board in a general-purpose computer system an analog input signal representing transient phenomena detected at a monitored location is received. A characteristic of the detected transient phenomena is continuously measured at the circuit board. On the circuit board, an analog output signal representing the measured characteristic is produced. The analog output signal representing the measured characteristic is converted on the circuit board into a digital signal representing the measured characteristic. The digital signal is transmitted onto a digital signal bus in the general-purpose computer system. The measured characteristic can be sampled at periodic intervals without interrupting the continuous measuring of the characteristic.

In one embodiment, a peak value of the characteristic attained by the analog input signal during a sampling interval is measured. A current value of the characteristic from the analog input signal is provided. The peak value is reset to the current value at the start of a subsequent sampling interval.

DESCRIPTION OF THE FIGURES

The above and further objects, features, and advantages of the invention will become clear from the following detailed description when read with reference to the accompanying drawings in which.

DETAILED DESCRIPTION OF THE INVENTION

Figure 1:
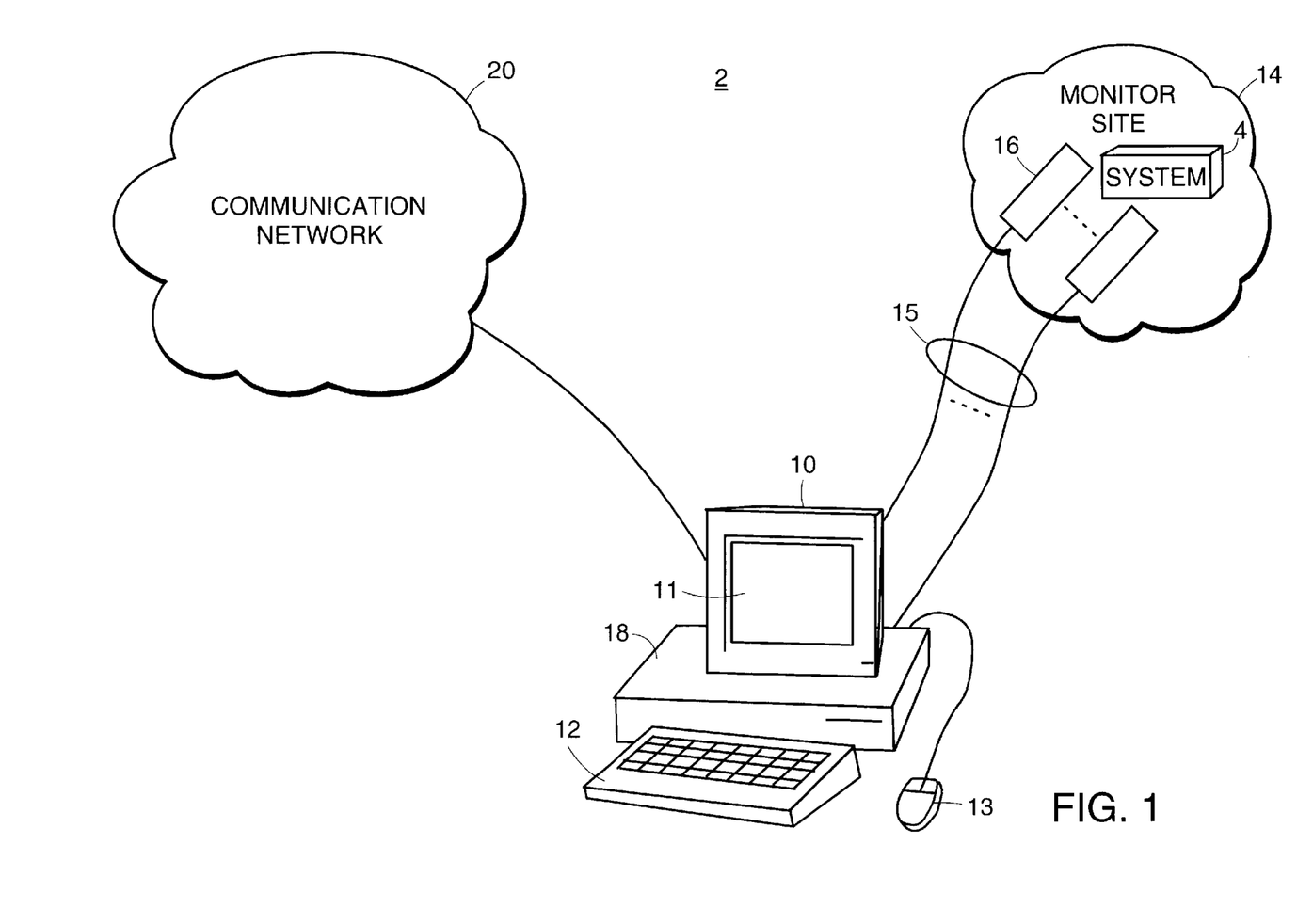
FIG. 1 is a diagram of a computer-based transient monitoring system including a general-purpose computer system embodying the principles of the invention.

FIG. 1 shows a computer-based transient pulse monitoring (TPM) system 2 embodying the principles of the invention for detecting and characterizing transient phenomena that occur at a monitor site 14. The transient phenomena are any type of stimuli, occurring naturally or manmade, that can affect the operational behavior of a system 4 located at the monitor site 14 when exerted against that system. Examples of transient phenomena include transients induced by electromagnetic fields, static electricity, lightning, thermal shock, mechanical shock, vibration, noise, acoustic waves, photoelectric input, optical impulses, ultraviolet, infrared, and visible light, radiation, chemical reactions, the flow of air, gases, and fluids, humidity, pressure, etc. The particular transient phenomena measured by the TPM system 2 depend upon the particular sensitivities of the system 4 being monitored at the monitor site 14. The monitor site 14 can be any environment exposed to the transient phenomena. In one exemplary embodiment, the monitor site 14 is a rocket launch pad used for launching spacecraft.

The TPM system 2 includes a general-purpose computer system 10 in communication with the monitor site 14 over one or more channels 15 terminating at detectors-transducers 16 (hereafter transducer) located at the monitor site 14. In general, each transducer 16 is any device capable of detecting and converting transient phenomena, such as those described above, into electrical analog waveforms. In one embodiment, the transducers 16 are electromagnetic sensors used to monitor the monitor site 14 for the occurrence of electromagnetic transients, such as those that may be produced by lightning. Such sensors 16 can include current sensors, electric-field sensors, and B-dot sensors for measuring rate-of-change of the magnetic field in free space. Connections to the electromagnetic sensors 16 can be made with semi-rigid coaxial cables with outer shield conductors.

The computer system 10 can be any personal computer (e.g., 286, 386, 486, Pentium, Pentium II, IBM PC-compatible, etc), Macintosh computer, RISC Power PC, X-device, workstation, mini computer, main frame computer or other computing device capable of collecting and processing the electrical waveforms produced by the transducers 16. The computer system 10 includes a display screen 11, a keyboard 12, and a pointing input device (e.g., a mouse 13). Any one of a variety of operating system platforms can run on the computer system 10, including, for example, DOS, Windows 3.x, Windows 95, Windows 98, Windows NT 3.51, Windows NT 4.0, Windows CE, Macintosh, Java, and Unix. As described further in connection with FIG. 2, a chassis portion 18 of the computer system 10 houses a printed circuit board for processing the analog waveforms representing the detected transient phenomena. In one embodiment, the computer system 10 includes one such circuit board per transducer 16.

In one embodiment, the computer system 10 can be connected to a communications network 20, which can be, for example, a local-area network (LAN) or a wide area network (WAN) such as the Internet or the World Wide Web. The computer system 10 can connect to the network 20 through a variety of connections including standard telephone lines, LAN or WAN links (e.g., T1, T3, 56 kb, X.25), broadband connections (ISDN, Frame Relay, ATM), and wireless connections. Connections can be established using a variety of communication protocols (e.g., TCP/IP, IPX, SPX, NetBIOS, Ethernet, RS232, and direct asynchronous connections).

When connected to the network 20, the computer system 10 can function as a Web server that provides access to the collected transient phenomena data for downloading by other users connected to the network 20. The computer system 10 stores the collected data in a database and makes the data available in a raw format or provide one or more web pages that graphically present the collected data to the remote computer users. These other users can access the collected data through commercially available Web browsers executing on their remote computer systems or through use of standard file transfer protocols. Such collected data becomes available to these users in real-time, that is, the remote computer users can obtain or review the data as the computer system 10 collects it. Real-time access to the collected data is limited only by the bandwidth of the particular connections to the network 20.

In brief overview, the computer-based TPM system 2 continuously processes (in real-time) high-bandwidth analog input signals representative of transient phenomena detected by the transducers 16 at the monitor site 14. In one embodiment, the TPM system 2 reports upon a number of key parameters of the transient waveforms generally understood by those skilled in the art to be significant for evaluating electromagnetic transients. These parameters include positive and negative peak amplitudes, the energy in the transient waveform (i.e., an integral of the transient waveform squared), and the power in the transient waveform. It is to be understood, however, that the measurement of other types of parameters fall within the scope of the principles of the invention. The parameters measured can depend upon the character of the transient phenomena being evaluated.

The computer system 10 performs each measurement of a parameter (i.e., quantifies the parameter) in the analog domain to maintain a wide analog bandwidth and dynamic range generally unattainable with current digitizing systems and converts the quantified parameters into digital signals at a predetermined sample rate. Quantifying a particular parameter involves generating a voltage level from the analog input signal for that parameter. The computer system 10 then stores the collected digital information within the database to make the digital information available to other computer systems over the network 20 as described above.

Figure 2:
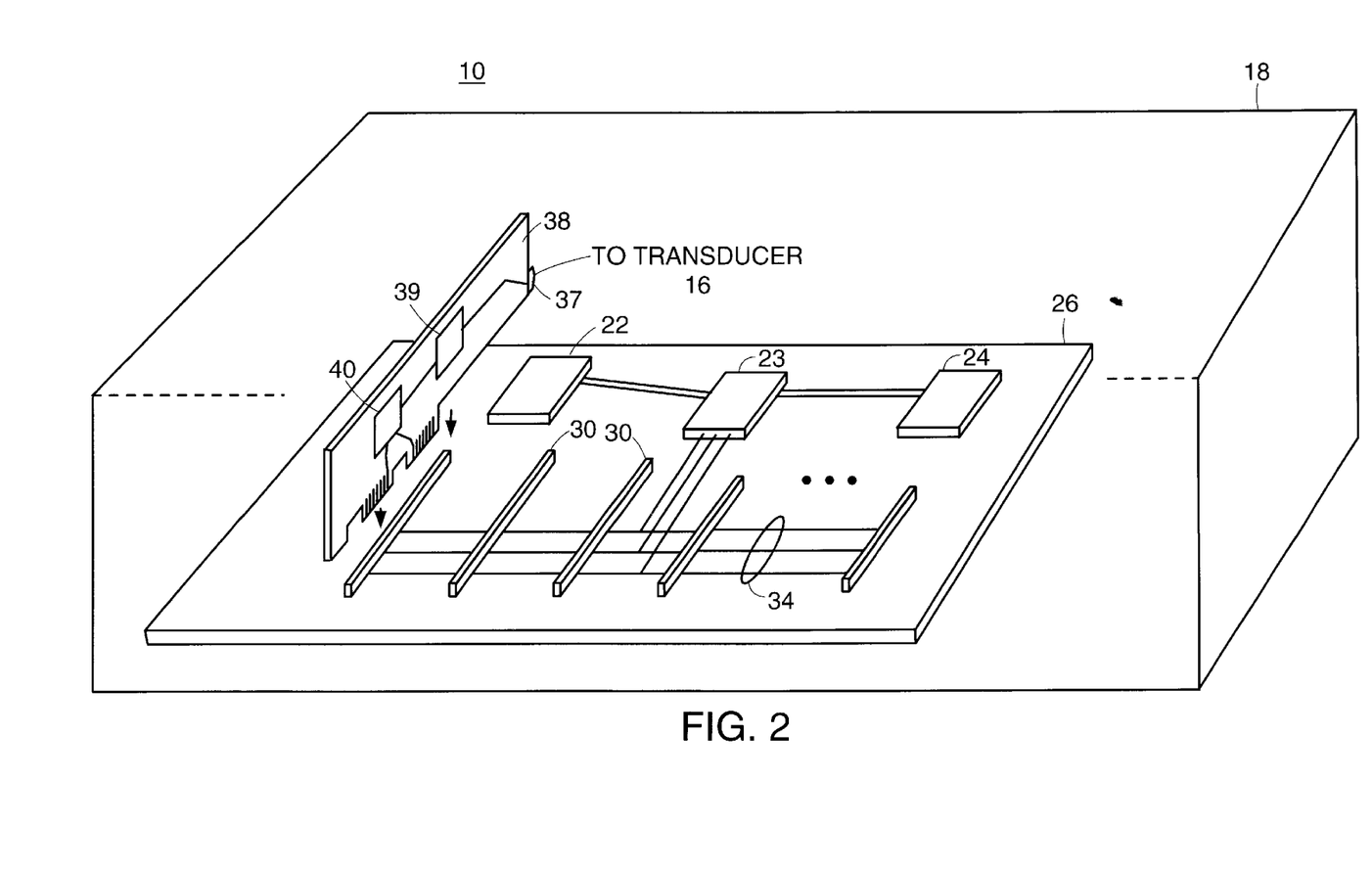
FIG. 2 is an internal view of a chassis portion of the computer system of the invention.

FIG. 2 shows an internal view of the chassis portion 18 of the general-purpose computer system 10. In one embodiment, the chassis portion 18 houses a motherboard 26 having a processor 22, a bus interface 23, memory 24, and connectors 30 attached to a surface thereof. Each connector 30 can receive a printed circuit board 38 of the invention (hereafter called a transient pulse monitor or TPM board). In one embodiment, the chassis portion 18 houses sixteen printed circuit boards 38, each board 38 independently processing transient phenomena detected by the transducer 16 connected to that board 38. Accordingly, the computer system 10 can simultaneously monitor and characterize transient phenomena obtained from sixteen different locations at the monitor site 14. A single power supply of the computer system 10 (not shown) can provide power to the motherboard 26 and each circuit board 38.

Through the connectors 30, each TPM board 38 is in electrical communication with a digital signal bus 34. Any proprietary or commercially standard electrical signal bus that can convey digital signals representing data, address, and control information can serve as the digital signal bus 34. For example, the digital signal bus 34 can be any one of a variety of standard computer busses such as, for example, ISA (Industry Standard Architecture), EISA bus, Micro Channel, X-bus, VESA VL bus, PCI (Peripheral Component Interconnect), Compact-PCI, USB (Universal Serial Bus), Sbus, IEEE 1394 (Firewire), etc. On the bus 34, each TPM board 38 operates as a uniquely addressable device that can communicate with the processor 22 and memory 24 in the computer system 10 through the bus interface 23. The processor 22 can access each of the TPM boards 38 to obtain data representing quantified transient characteristics produced by that TPM board 38.

The TPM board 38 is connected to one of the transducers 16, for example, through a conventional SMA connector 37, and includes analog circuitry 39 for receiving analog input signals representing the transient phenomena detected by that transducer 16. This analog circuitry 39 continuously measures parameters of the detected transient phenomena and produces an analog output signal representing the measured parameters at sampled intervals. Accordingly, the processing and characterizing of the received transient waveforms occur entirely within the analog domain. The TPM board 38 also includes a digital interface 40 in communication with the analog circuitry 39 and the digital signal bus 34. The digital interface 40 converts the analog output signals representing the sampled parameters into a digital signal representing the measured parameters and transmits the digital signal onto the digital signal bus 34.

Figure 3:
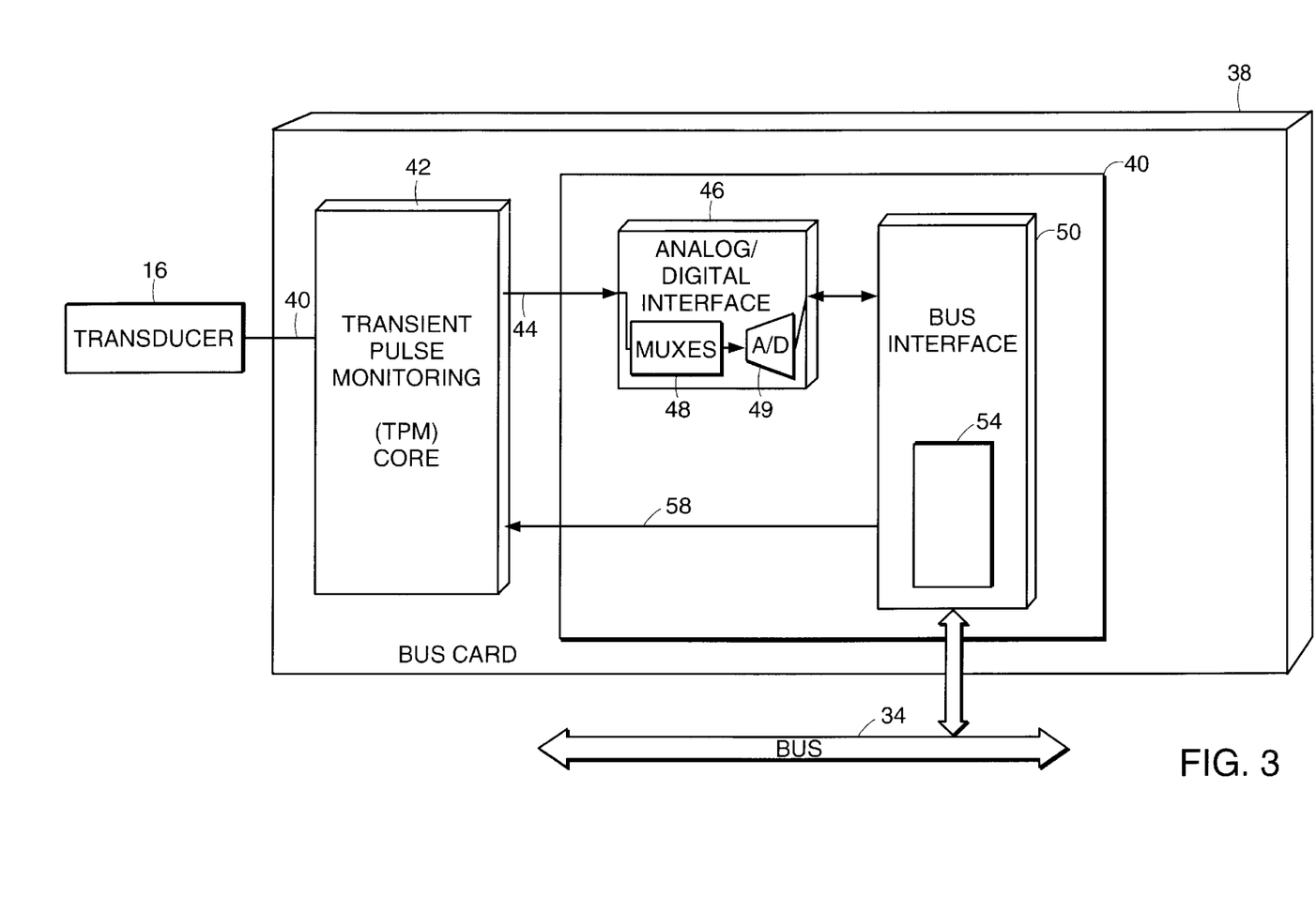
FIG. 3 is an exemplary functional block diagram of components of a circuit board within the computer system.

FIG. 3 shows an exemplary functional block diagram of components of one representative TPM card 38 of the invention. The TPM card 38 includes a transient pulse monitoring (TPM) core 42, an analog-to-digital (A/D) interface 46, and a digital signal bus interface 50. The TPM core 42 is in communication with one of the transducers 16 located at the monitor site 14. Disposed between the TPM core 42 and the bus interface 50 is the A/D interface 46. In addition, the bus interface 50 is in communication with the TPM core 42 over signal bus 58 and with the digital signal bus 34.

The TPM core 42 includes analog circuitry that processes the continuous stream of analog input signals 40 from the transducer 16 and has an analog bandwidth in excess of 250 MHz. The TPM processing core 42 produces analog output signals 44 representative of the quantified parameters. At periodic intervals, e.g., once per second, these analog output signals 44 are sampled. Such an infrequent sample rate is much lower than that used by a pure digitizing system, which can require millions of samples per second to determine the largest value of each parameter during a sampling period.

The A/D interface 46 includes analog multiplexers 48 coupled to an A/D converter 49. The multiplexers 48 select one of the parameters from among the various parameters quantified by the TPM core 42 and pass the analog output signal representing that selected parameter to the A/D converter 49. The A/D converter 49 digitizes the selected analog output signal and forwards the resulting digital signal to the bus interface 50. Commercially available integrated circuits can be used to implement the analog multiplexers 48 and the AID converter 49. For example, the ADG508A and the AD977 integrated circuits, both manufactured by Analog Devices of Bedford, Mass., can be used to implement the analog multiplexers 48 and the A/D converter 49, respectively.

The bus interface 50 includes a bus interface device 54 that controls the transfer of analog and digital signals among the analog circuitry of the TPM core 42, the A/D interface 46, the digital signal bus 34, and the processor 22 of the computer system. In one embodiment, this interface device is implemented with a Programmable Logic Device, e.g., Altera EPF10K20, manufactured by Altera of San Jose, Calif. This particular bus interface device 54 is designed to communicate with an ISA bus. Other embodiments employ different bus interface devices that are designed to interface with those other types of digital signal busses described above.

During operation, the sensor 16 continuously transmits analog signals 40 to the TPM core 42, which the TPM core 42 converts into quantified, analog electrical signals 44 representing a variety of transient parameters. Under the control of the processor 22, the bus interface 50 periodically issues a sample signal to the TPM core 42 over the signal lines 58. The TPM core 42 holds the quantified parameters 44 until the sample signal is received. As described in more detail below in connection with FIG. 8, the sample signal operates to capture the presently held voltage level for each quantified parameter and then to reset each quantified parameter to a new voltage level. According to the principles of the invention, the new reset voltage for each parameter is the current voltage level of the analog input signal 40. Thus, the characterization of the analog input signal 40 remains uninterrupted by the sampling event.

The bus interface 50 also issues select signals to the multiplexers 48 of the A/D interface 46 to serially select each of the sampled, quantified transient parameters for digitizing by the A/D converter 49 and subsequent transfer to the bus interface 50. The bus interface 50 transmits the digitized transient parameters onto the bus 34 for manipulation by the processor 22, such as storing in the memory 24 or distributing through the communications network 20.

Figure 4:
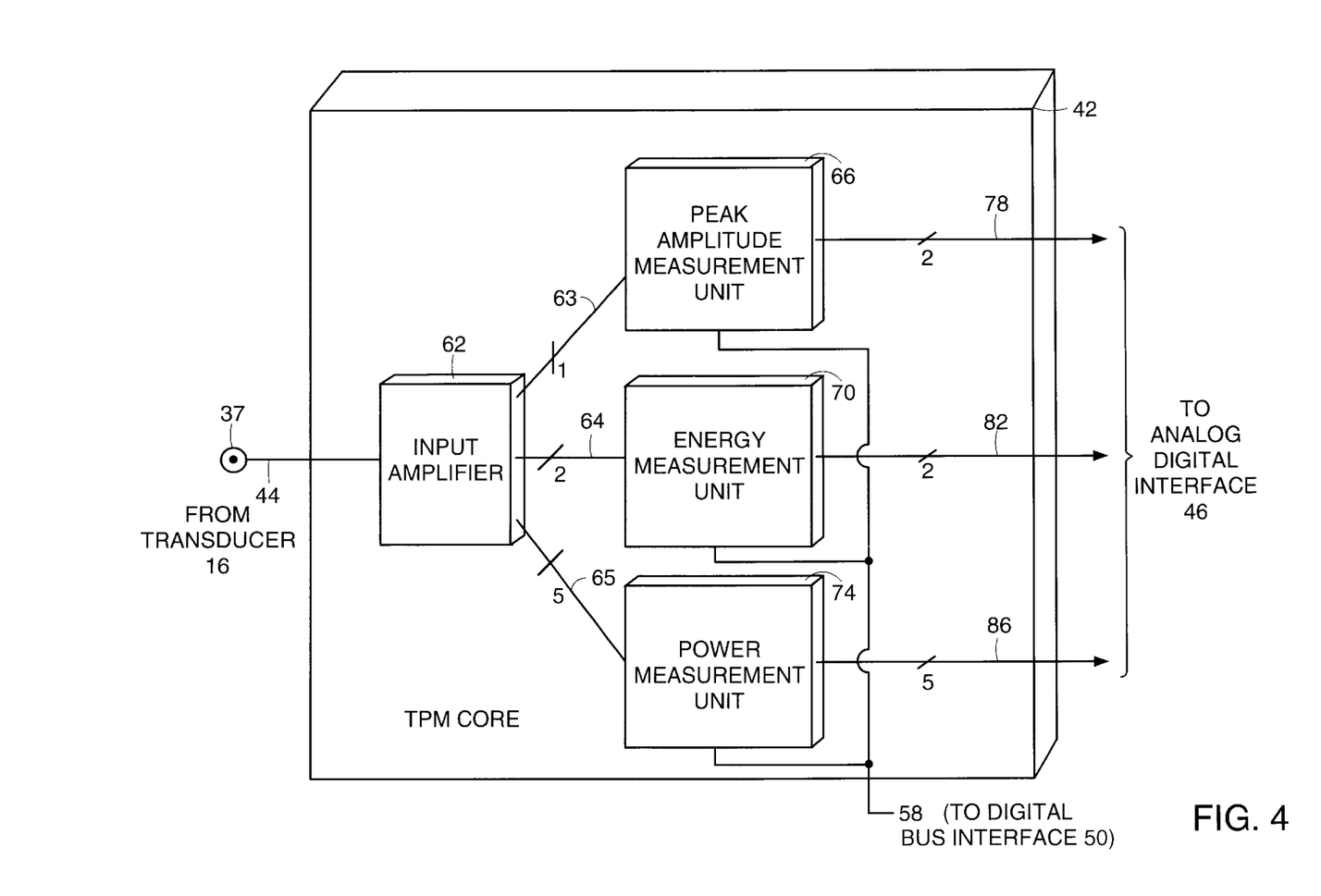
FIG. 4 is an exemplary block diagram of circuitry on the circuit board of FIG. 3 embodying a transient pulse monitoring core that includes a peak amplitude measurement unit, an energy measurement unit, and a power measurement unit.

FIG. 4 shows a functional block diagram of an exemplary embodiment of the TPM core 42. The TPM core 42 includes an input amplifier 62, a peak amplitude measurement unit 66, an energy measurement unit 70, and a power measurement unit 74. The input amplifier 62 is in communication with the transducer 16 for receiving analog input signals 44 and with the measurement units 66, 70, and 74 for forwarding the received analog signals 44. Low noise input amplifiers provide the necessary input impedance, input protection, and current drive that enables a fan out of the acquired analog input signal 44 to the measurement units 66, 70, and 74.

Each of the measurement units 66, 70, 74 converts the analog input signal into one or more quantified transient parameters. In one embodiment, the peak amplitude measurement unit 66 measures two parameters, the energy measurement unit 70 measures two parameters, and the power measurement unit 74 measures five parameters. In this embodiment, the two parameters measured by the peak amplitude unit 66 are positive peak and negative peak amplitude. The two parameters measured by the energy measurement unit 70 are high-gain and low-gain. The five parameters measured by the power measurement unit 74 are five power values determined from five frequency decades as described in more detail below in connection with FIG. 7. The sample signal 58 received from the digital bus interface 50 synchronously supplies each quantified parameter (i.e., analog signal outputs 78, 82, 86) produced by the measurement units 66, 70, 74, respectively, to the A/D interface 46.

Figure 5:
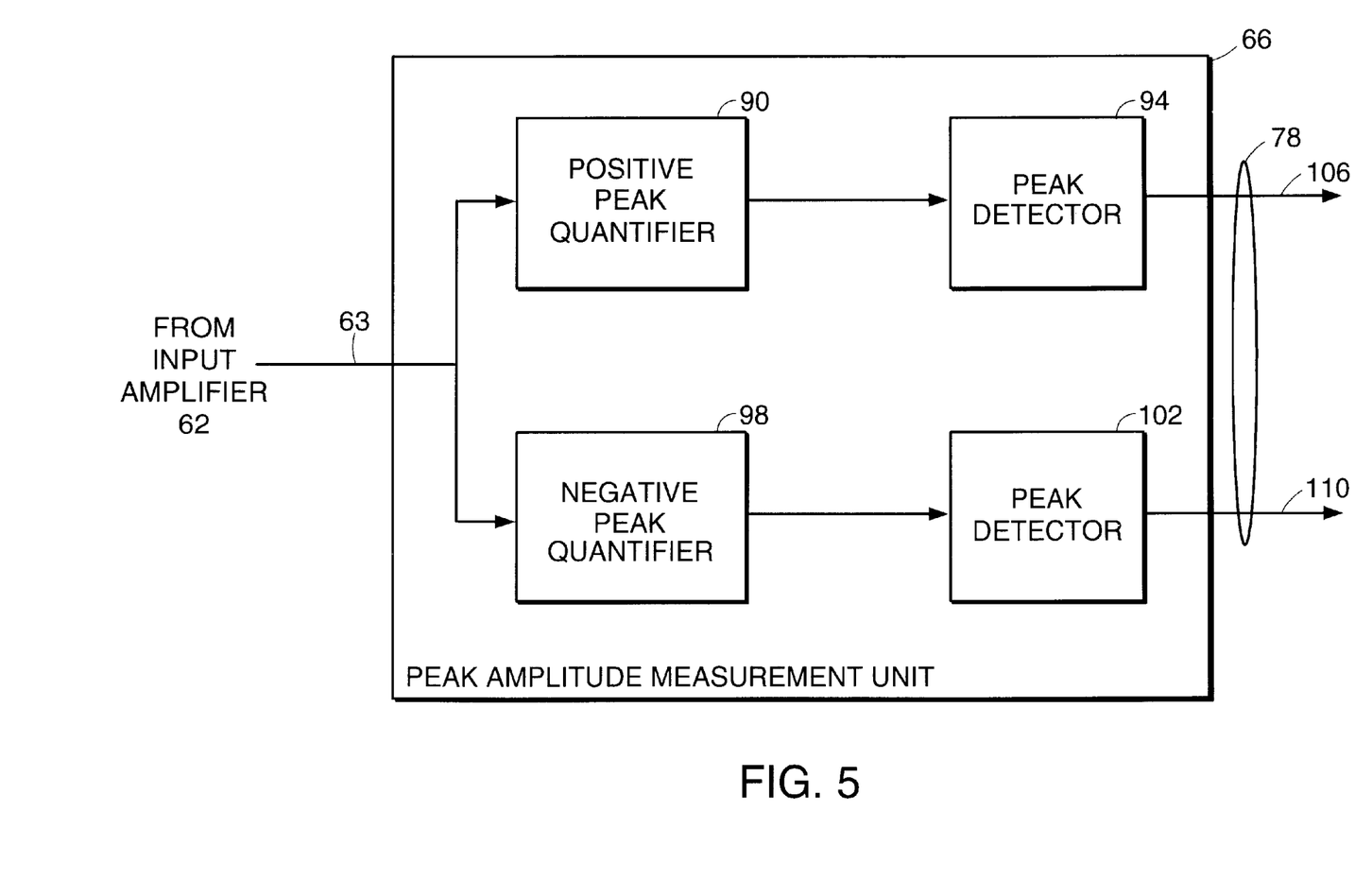
FIG. 5 is an exemplary block diagram of functional components of the peak amplitude measurement unit shown in FIG. 4.

FIG. 5 shows an exemplary block diagram of functional components of the peak amplitude measurement unit 66 of the invention used to measure the peak positive and negative amplitude parameters mentioned above. The peak amplitude measurement unit 66 includes a positive peak quantifier 90 coupled to a peak detector 94 and a negative peak quantifier 98 coupled to a second peak detector 102. The positive peak quantifier 90 and peak detector 94 respond to the maximum positive amplitude in the input signal 63 to produce an analog output signal 106. The analog output signal 106 represents the maximum positive voltage attained by the analog input signal 63 during a particular sample period. During that same sample period, the negative peak quantifier 98 and second peak detector 102 respond to the maximum negative amplitude in the input signal 63 to produce an analog output signal 110 representing the maximum negative voltage attained by the analog input signal 63. Suitable circuits for implementing the positive peak and negative peak quantifiers 90, 98 are known in the art. An exemplary circuit for implementing the peak detectors is described below in connection with FIG. 8.

Figure 6:
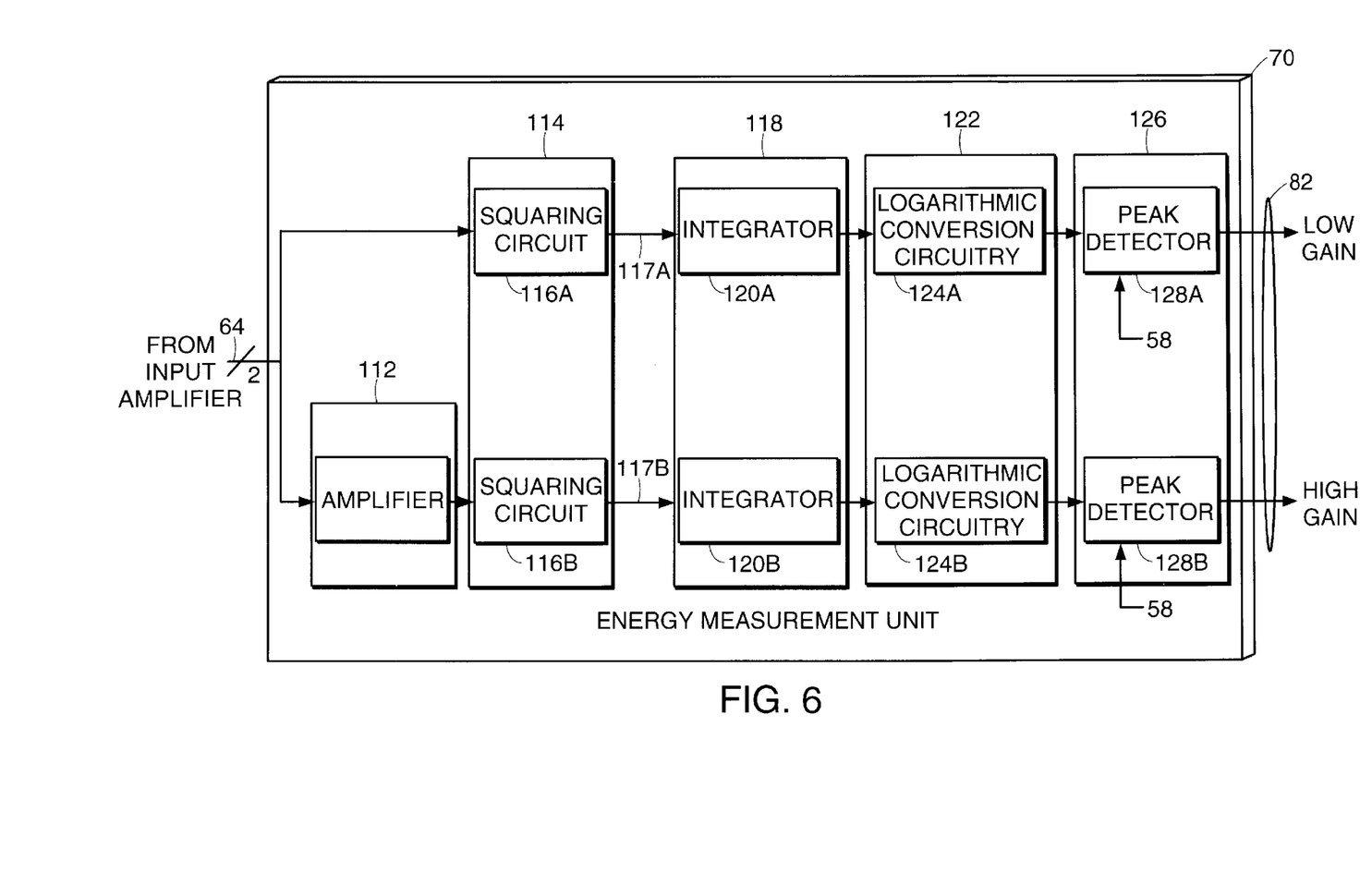
FIG. 6 shows an exemplary block diagram of functional components of the energy measurement unit shown in FIG. 4.

FIG. 6 shows an exemplary block diagram of functional components of the energy measurement unit 70 of the invention used to measure the low gain and high gain parameters. To measure the transient energy, the analog input signal 64 passes through at least four successive stages: a squaring stage 114, an integration stage 118, a logarithmic conversion stage 122, and a peak detection stage 126. Measurement of the high gain parameter requires the input signal to pass through an amplification stage 112 before passing to the squaring stage 114.

The amplification stage 112 increases the input signal level for the high gain parameter so that low level input signals can be characterized. This gain increases the overall dynamic range of the energy measurement. The gain of the amplification stage 112 is typically chosen such that the high gain stage begins to saturate at input levels slightly higher than the lowest input signal levels measurable by the low gain stage. Consequently, a broader range of input levels is measurable by the combined high gain and low gain components of the energy measurement unit 70.

The squaring stage 114 includes squaring circuitry 116A, 116B for producing a squared waveform 117A, 117B, respectively, of the input signal 64. In one embodiment, the squaring circuitry 116A, 116B are analog multiplication devices, such as the AD834 manufactured by Analog Devices of Bedford, Mass. To produce the square of the waveform, the input signal 64 is fed into two inputs of the AD834 device. From the squaring stage 114, the squared waveforms 117A, 117B pass to integrator circuitry 120A, 120B, respectively. Integration of the squared waveform calculates the energy of the input signal. Analog circuits that perform integration are known in the art.

From the integration stage 118, the integrated square waveforms pass to the logarithmic conversion stage 122, which includes logarithmic conversion circuitry 124A, 124B to compress the waveform to its decibel equivalent. Commercially available logarithmic amplifiers, such as the AD8307 manufactured by Analog Devices can be used to implement the logarithmic conversion circuitry 124A, 124B. The compressed signals 125A, 125B pass to the peak detection stage 126, which includes peak detectors 128A, 128B for capturing the maximum voltage level attained by the compressed signals 125A, 125B, respectively, during a sample period as indicated by the sample signal 58. Implementation of the peak detectors 128A, 128B is described below in connection with FIG. 8.

Figure 7:
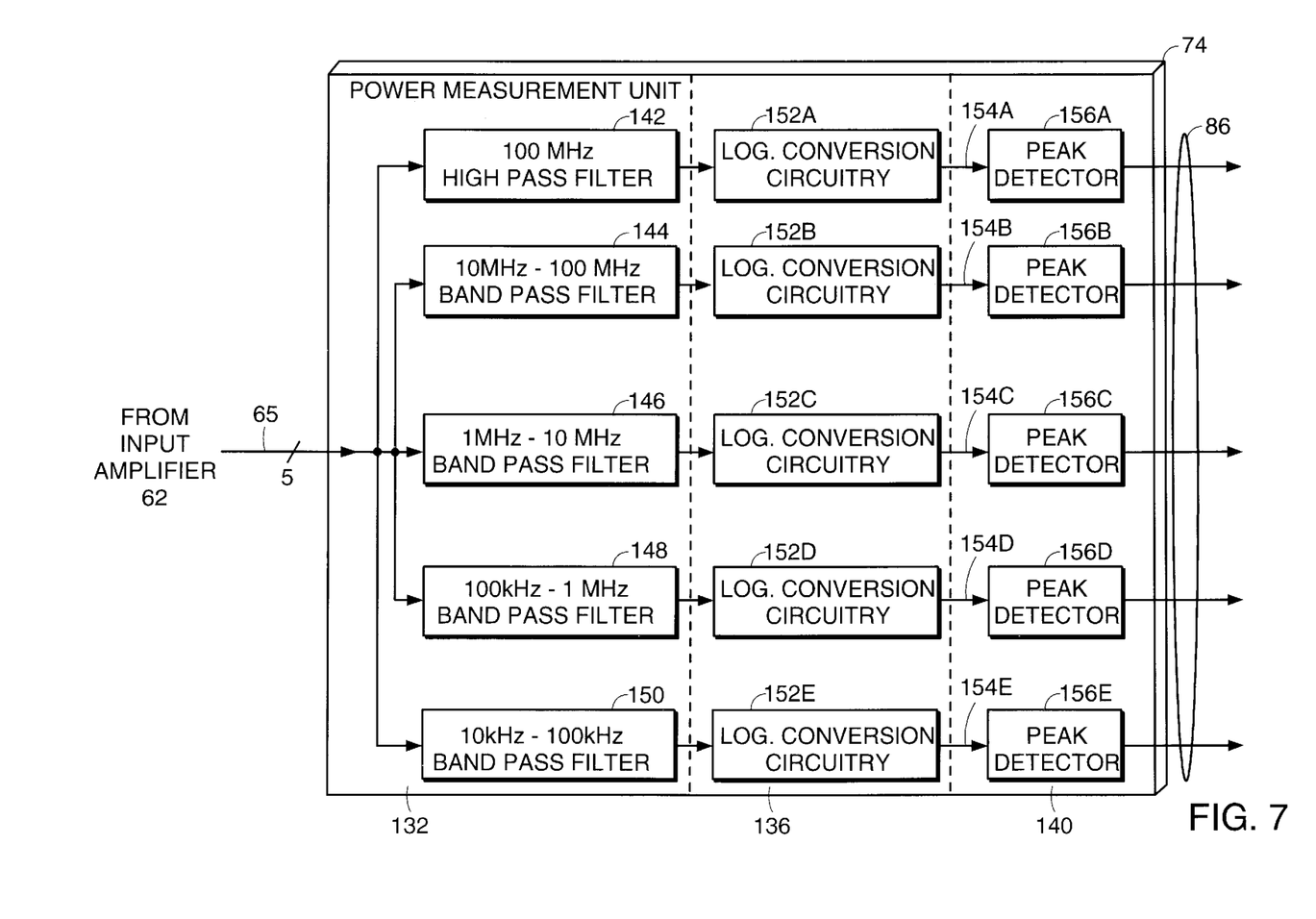
FIG. 7 is an exemplary block diagram of functional components of the power measurement unit shown in FIG. 4.

FIG. 7 shows an exemplary block diagram of functional components of the power measurement unit 74 of the invention used to measure five parameters representing the power in the input signal 65. To measure the power, the analog input signal 65 passes through at least three successive stages: a filtering stage 132, a logarithmic conversion stage 136, and a peak detection stage 140. At the filtering stage 132, the input signal 65 is split into five frequency bands by five filters: a 100 MHz high pass filter 142, a 10 MHz–100 MHz band pass filter 144, a 1 MHz–10 MHz band pass filter 146, 100 kHz–1 MHz band pass filter 148, and 10 kHz–100 kHz band pass filter 150.

Each resulting decade of signal frequencies passes to a corresponding logarithmic conversion circuitry 152A–152E of the logarithmic conversion stage 136, which subsequently compresses each signal to a decibel equivalent. The compressed signals 154A–154E produced by the logarithmic conversion circuitry 152A–152E, respectively, then pass to peak detectors 156A–156E of the peak detection stage 140. The peak detectors 156A–156E capture the maximum voltage level attained by the compressed signals 154A–154E, respectively, during a sample period as defined by the sample signal 58.

Figure 8:
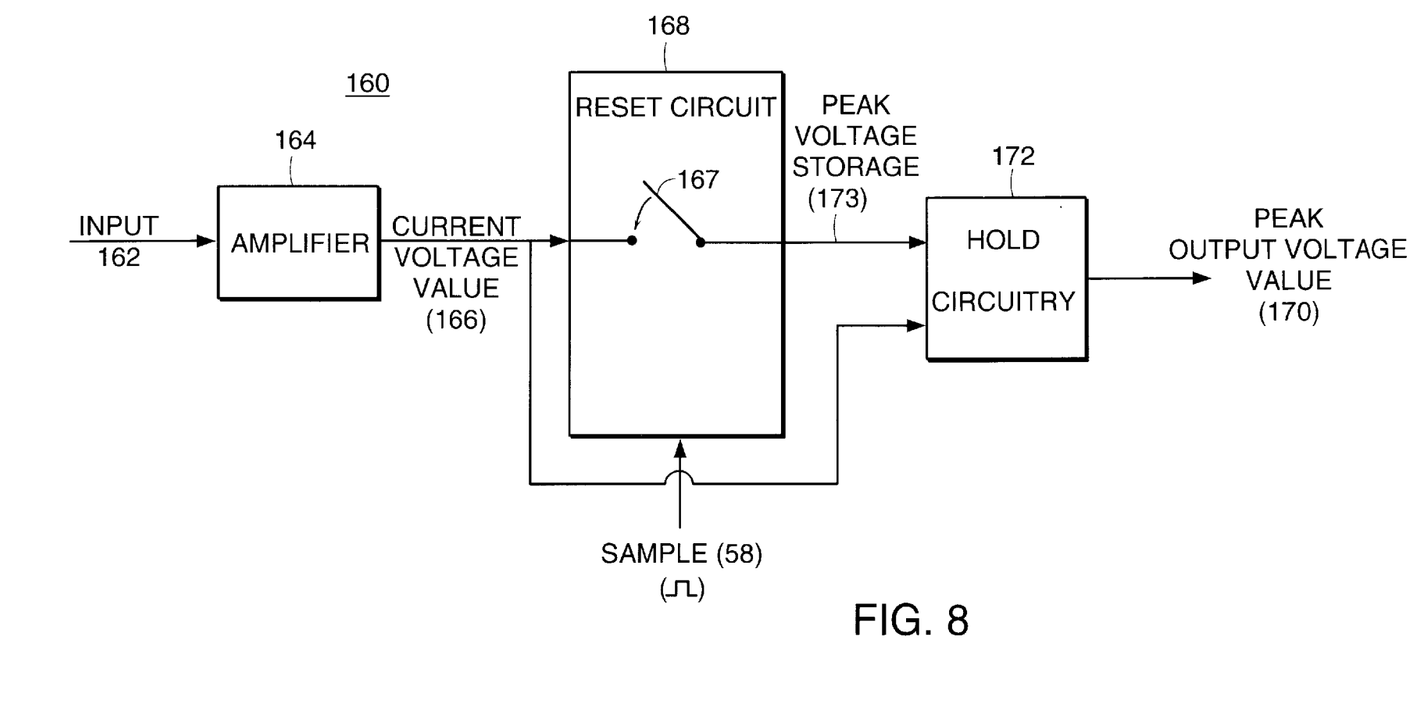
FIG. 8 is an exemplary block diagram of a peak detector used by each of the measurement units shown in FIGS. 5–7.

FIG. 8 shows an exemplary block diagram of an exemplary embodiment of a peak detector 160 that can be used in each measurement unit 66, 70, and 74, described above. The description of the block diagram is merely illustrative of the functionality of the peak detector 160, and a variety of circuits can be employed to produce this functionality. This embodiment of the peak detector 160 includes an amplifier 164, a reset circuit 168, and hold circuitry 172. The amplifier 164 receives input 162 from a preceding stage of a corresponding measurement unit. For example, when the measurement unit is the peak measurement unit 66, the input comes from either the positive peak quantifier 90 or negative peak quantifier 98. When the measurement unit is either the energy measurement unit 70 or the power measurement unit 74, the input comes from the logarithmic conversion stage 122, 136, respectively.

From the input 162, the amplifier 164 produces an analog signal having a current value 166 quantified by the previous logarithmic conversion stage 122, 136 or peak quantifier 90, 98. The current quantified value 166 passes to the reset circuit 168 and the hold circuitry 172.

The reset circuit 168 is disposed between the amplifier 164 and hold circuitry 172. The reset circuit 168 includes a switch 167 and two inputs. One input receives the current value 166 from the amplifier 164, and the other input receives the sampling signal 58 from the bus interface 50. During a sampling period, the switch 167 remains open to allow peak holding operation. When the reset circuitry 168 receives a sample signal 58, the switch 167 temporarily couples the current value 166 to the hold circuitry 172.

The hold circuitry 172 can include two inputs: one input is the output of the reset circuit 168 and the other input is the current value 166 from the amplifier 164. In an another embodiment, the two inputs are the same input, and the hold circuitry 172 includes a capacitor that stores electrical charge in proportion to the peak voltage value encountered on that one input during a sampling period. Thus, when the current voltage value 166 is lower than the peak voltage value 170, no additional charge is stored by the capacitor, and the peak voltage value stored by the hold circuit 172 remains unchanged. Conversely, when the current voltage value 166 is larger than the peak value 170, then additional charge is stored by the capacitor to produce a new peak voltage value across the capacitor equivalent to the current voltage value 166.

In the illustrated embodiment, the hold circuitry 172 produces the peak output voltage value 170 stored during a sampling period. This stored value is available on at the peak voltage storage input 173. When the reset circuitry 168 receives a sample signal 58, the peak voltage storage input 173 is connected to the current voltage value 166, which causes the peak output voltage value 170 to reproduce the current voltage value 166. At the start of each new sampling period, the peak output voltage value 170 that is produced by the hold circuitry 172 is therefore reset to the current voltage value 166 produced by the amplifier 164. If the current voltage value 166 is zero, the peak voltage storage value 173 is reset to zero, and consequently the peak output voltage value 170 is also set to zero. If the current voltage value 166 is not zero, the peak voltage storage value 173 is reset to the instantaneous voltage of the output of amplifier 164 and the peak output voltage value 170 is also set to this value. Consequently, the reset circuitry 168 does not interfere with the fully continuous measurement of the transient characteristic.

This reset mechanism differs from conventional sample-and-hold circuitry in the following way: conventional sample-and-hold circuitry is reset by momentarily grounding the hold component to set it to zero in preparation for the next signal level acquisition. During this relatively brief but finite reset event, the incoming signal cannot be captured. This leads to a brief dead time during each sampling interval, and, thus, non-continuous measurement of the input signal. Here, the reset circuitry 168 of the invention resets the sample-and-hold component to the actual level of the input signal present during the reset event interval. Consequently, reset of the sample-and-hold circuitry does not interfere with the fully continuous measurement of the transient characteristic.

Figure 9:
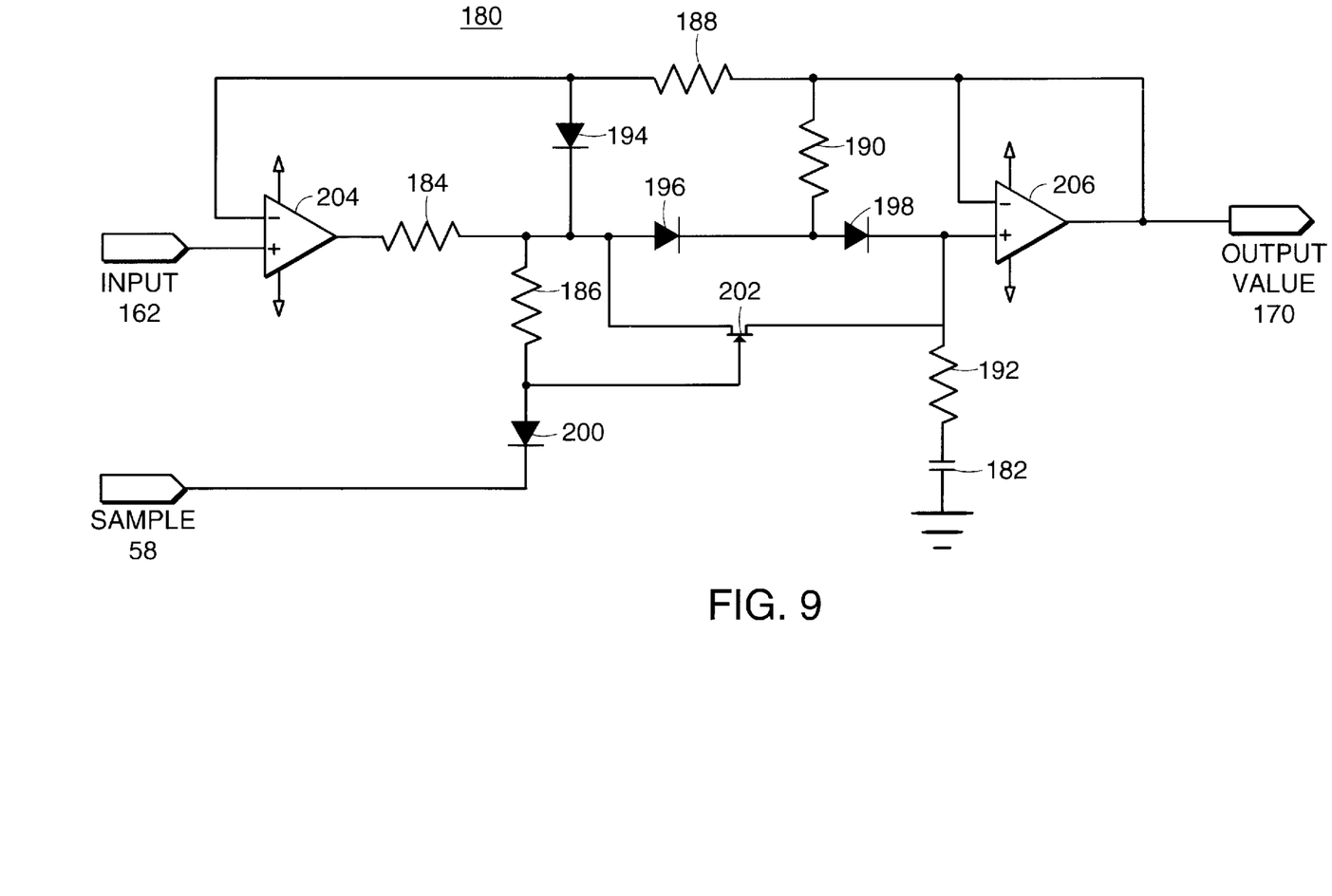
FIG. 9 is an exemplary circuit diagram of an embodiment of the peak detector shown in FIG. 8.

FIG. 9 shows an exemplary embodiment of a circuit 180 for implementing the peak detector 160 of FIG. 8. The exemplary circuit 180 uses discrete components exclusively (i.e., capacitor 182, resistors 184–192, diodes 194–200, transistor 202, and operational amplifiers 204, 206). The exclusive use of discrete components enables the peak detector 160 to attain a wide dynamic range and achieve good response to high speed pulses. The high speed of operational amplifier 204 and diodes 196 and 198, the low resistance of resistor 192, and small capacitance of capacitor 182 attain the high-speed response of the circuit 180. The small bias current of operational amplifier 206 and low leakage current of transistor 202 achieve long hold time.

While the invention has been shown and described with reference to specific preferred embodiments, it should be understood by those skilled in the art that various changes in form and detail may be made therein without departing from the spirit and scope of the invention as defined by the following claims.

What is claimed is:

1. A circuit board for characterizing transient phenomena that occur at a monitored location, the circuit board usable in a general-purpose computer system including a processor, memory, and a digital signal bus for conveying digital signals, the circuit board comprising:

analog circuitry receiving an analog input signal representing transient phenomena detected at the monitored location, the analog circuitry continuously measuring a characteristic of the detected transient phenomena and producing an analog output signal representing the measured characteristic, wherein the analog circuitry has an approximate range of operation between 10 kHz and 250 MHz for measuring the characteristic; and a digital interface, in communication with the analog circuitry and the digital signal bus, for converting the analog output signal into a digital signal representing the measured characteristic and for transmitting the digital signal onto the digit signal bus.

2. The circuit board of claim 1 wherein the analog circuitry includes a peak detector for measuring a peak value of the characteristic attained by the analog input signal during a sampling interval, the peak detector comprising:

(a) hold circuitry for holding the peak value;

(b) input circuitry for providing a current value of the characteristic from the analog input signal; and (c) reset circuitry coupled to the hold circuitry and the input circuitry, wherein the reset circuitry resets the peak value held by the hold circuitry to the current value at the start of a subsequent sampling interval.

3. The circuit board of claim 1 wherein the digital signal bus is an Industry Standard Architecture (ISA) bus.

4. The circuit board of claim 1 wherein the analog circuitry comprises:

power measurement circuitry measuring a peak power attained by the analog input signal during a sampling interval;

energy measurement circuitry measuring a peak energy attained by the analog input signal during the sampling interval; and amplitude measurement circuitry measuring peak negative amplitude and peak positive amplitude attained by the analog input signal during the sampling interval.

5. The circuit board of claim 4 wherein the power measurement circuitry comprises:

(a) a plurality of filters separating the analog input signal into a plurality of frequency bands; and (b) a plurality of detectors, each coupled to one of the filters, for concurrently measuring a peak power attained in each of the frequency bands by the analog input signal during a sampling interval.

6. The circuit board of claim 4 wherein the energy measurement circuitry comprises:

(a) squaring circuitry squaring the analog input signal;

(b) an integrator coupled to the squaring circuitry and integrating the squared analog input signal;

(c) a logarithmic conversion circuitry coupled to the integrator and converting the integrated squared analog input signal into a decibel equivalent value; and (d) a peak detector coupled to the logarithmic conversion circuitry and detecting a peak decibel equivalent value attained during the sampling interval.

7. The circuit board of claim 1 wherein the transient phenomena are electromagnetic transients.

8. A general-purpose computer system for characterizing transient phenomena that occur at a monitored location, comprising:

memory;

a motherboard having a digital signal bus for conveying digital signals;

a processor in communication with the memory and the digital signal bus; and a circuit board removably connected to the motherboard and in communication with the processor over the digital signal bus, the circuit board comprising (a) analog circuitry for receiving an analog input signal representing transient phenomena detected at the monitored location, the analog circuitry continuously measuring a characteristic of the detected transient phenomena and producing an analog output signal representing the measured characteristic, wherein the analog circuitry has an approximate range of operation between 10 kHz and 250 MHz for measuring the characteristic, and (b) a digital interface, in communication with the analog circuitry and the digital signal bus, for converting the analog output signal into a digital signal representing the measured characteristic and for transmitting the digital signal onto the digital signal bus.

9. The computer system of claim 8 wherein the computer system is connected to a network over which other computer systems connected to the network can access information corresponding to the measured characteristic as the computer system produces and records the information.

10. The computer system of claim 8 wherein the analog circuitry includes a peak detector for measuring a peak value of the characteristic attained by the analog input signal during a sampling interval, the peak detector comprising:

(a) hold circuitry holding the peak value;

(b) input circuitry providing a current value of the characteristic from the analog input signal; and (c) reset circuitry coupled to the hold circuitry and the input circuitry, wherein the reset circuitry resets the peak value held by the hold circuitry to the current value at the start of a subsequent sampling interval.

11. The computer system of claim 8 wherein the analog circuitry comprises:

power measurement circuitry measuring a peak power attained by the analog input signal during a sampling interval;

energy measurement circuitry measuring a peak energy attained by the analog input signal during the sampling interval; and amplitude measurement circuitry measuring peak negative amplitude and peak positive amplitude attained by the analog input signal during the sampling interval.

12. A transient phenomena monitoring system comprising:

a transducer installed at a location exposed to transient phenomena for producing an analog input signal representing detected transient phenomena; and a sensor system coupled to the transducer, the sensor system including a general-purpose computer system having a processor, a digital signal bus, and a circuit board in communication with the processor over the digital signal bus, the circuit board comprising (a) analog circuitry for receiving the analog input signal representing transient phenomena detected by the transducer, the analog circuitry continuously measuring a characteristic of the detected transient phenomena and producing an analog output signal representing the measured characteristic, wherein the analog circuitry has an approximate range of operation between 10 kHz and 250 MHz for measuring the characteristic, and (b) a digital interface, in communication with the analog circuitry and the digital signal bus, for converting the analog output signal into a digital signal representing the measured characteristic and for transmitting the digital signal onto the digital signal bus.

13. The monitoring system of claim 12 wherein the computer system is connected to a network over which other computer systems connected to the network can access information corresponding to the measured characteristic as the computer system produces and records the information.

14. The monitoring system of claim 12 wherein the analog circuitry includes a peak detector for measuring a peak value of the characteristic attained by the analog input signal during a sampling interval, the peak detector comprising (a) hold circuitry for holding the peak value;

(b) input circuitry for providing a current value of the characteristic from the analog input signal; and (c) reset circuitry coupled to the hold circuitry and the input circuitry, wherein the reset circuitry resets the peak value held by the hold circuitry to the current value at the start of a subsequent sampling interval.

15. The monitoring system of claim 12 wherein the analog circuitry comprises:

power measurement circuitry measuring a peak power attained by the analog input signal during a sampling interval;

energy measurement circuitry measuring a peak energy attained by the analog input signal during the sampling interval; and amplitude measurement circuitry measuring peak negative amplitude and peak positive amplitude attained by the analog input signal during the sampling interval.

16. In a client-server network, a computer system connected to the network, comprising:

memory;

a transient monitor producing data corresponding to a characteristic of transient phenomena detected at a monitored location, the transient monitor having an approximate range of operation between 10 kHz and 250 MHz for measuring the characteristic; and a processor, in communication with the transient monitor and the memory, storing the produced data in the memory in a format that permits access to the data by other computer systems connected to the network.

17. A method for monitoring transient phenomena, the method comprising:

receiving at a circuit board in a general-purpose computer system an analog input signal representing transient phenomena detected at a monitored location;

continuously measuring at the circuit board a characteristic of the detected transient phenomena;

sampling the measured characteristic at periodic intervals without interrupting the continuous measuring of the characteristic;

producing on the circuit board an analog output signal representing the measured characteristic;

converting on the circuit board the analog output signal representing the measured characteristic into a digital signal representing the measured characteristic; and transmitting the digital signal onto a digital signal bus in the general-purpose computer system.

18. The method of claim further comprising the steps of:

measuring a peak value of the characteristic attained by the analog input signal during a sampling interval;

providing a current value of the characteristic from the analog input signal; and resetting the peak value to the current value at the start of a subsequent sampling interval.

* * * * *